(12) United States Patent
Eglinger et al.

(10) Patent No.: US 8,059,407 B2
(45) Date of Patent: Nov. 15, 2011

(54) CONTROL DEVICE FOR A MOTOR VEHICLE

(75) Inventors: Markus Eglinger, Neustadt/Aisch (DE); Juergen Henniger, Erlangen-Dechsendorf (DE); Matthias Gramann, Renchen (DE); Alexander Wenk, Burgoberbach (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 155 days.

(21) Appl. No.: 12/311,991

(22) PCT Filed: Oct. 16, 2007

(86) PCT No.: PCT/DE2007/001837
§ 371 (c)(1),
(2), (4) Date: Apr. 20, 2009

(87) PCT Pub. No.: WO2008/046401
PCT Pub. Date: Apr. 24, 2008

(65) Prior Publication Data
US 2010/0020495 A1    Jan. 28, 2010

(30) Foreign Application Priority Data
Oct. 20, 2006  (DE) .......................... 10 2006 049 592

(51) Int. Cl.
*H05K 7/20*         (2006.01)
(52) U.S. Cl. ... 361/702; 361/704; 361/714; 361/679.01; 361/807
(58) Field of Classification Search ............. 361/679.01, 361/702, 704, 714, 807; 29/825
See application file for complete search history.

(56) References Cited

U.S. PATENT DOCUMENTS

| | | |
|---|---|---|
| 5,311,398 A | 5/1994 | Schirmer et al. |
| 5,586,388 A | 12/1996 | Hirao et al. |
| 5,831,836 A | 11/1998 | Long et al. |
| 5,949,137 A | 9/1999 | Domadia et al. |

(Continued)

FOREIGN PATENT DOCUMENTS
DE    39 13 066    11/1990
(Continued)

OTHER PUBLICATIONS

PCT, International Preliminary Report on Patentability for Application No. PCT/DE2007/001837, dated May 5, 2009, 7 pages, International Bureau of WIPO, Geneva, Switzerland.

*Primary Examiner* — Anatoly Vortman
(74) *Attorney, Agent, or Firm* — W. F. Fasse; W. G. Fasse

(57) ABSTRACT

For a motor vehicle control device, a housing lid and a base plate form a hollow area that contains an interconnect device arranged on the inner side of the housing lid. The housing lid has at least one opening surrounding the interconnect device, adjacent to an electronic component and/or an electrical contact area on the interconnect device. On or in the opening, a flexible foil conductor strip is arranged with an end section thereof covering the opening. A lid plate covers the opening completely, and the interposed foil conductor strip is thus connected in an oil-tight manner with the housing lid. Electrical connection lines between the components and/or the contact areas on the interconnect device and an electrical contact area on the end section of the foil conductor strip create the electrical connection between the control electronics on the interconnect device and the surrounding area outside of the control device.

16 Claims, 2 Drawing Sheets

U.S. PATENT DOCUMENTS

| | | | |
|---|---|---|---|
| 6,104,618 | A | 8/2000 | Loibl |
| 6,300,565 | B1 | 10/2001 | Loibl et al. |
| 6,570,773 | B1 | 5/2003 | Loibl et al. |
| 6,805,146 | B2 * | 10/2004 | Albert et al. ............ 137/15.18 |
| 6,863,566 | B2 | 3/2005 | Scheuerer |
| 7,193,852 | B2 | 3/2007 | Wetzel |
| 7,749,134 | B2 * | 7/2010 | Wetzel et al. ............ 477/34 |
| 2002/0157502 | A1 * | 10/2002 | Albert et al. ............ 74/731.1 |
| 2006/0268529 | A1 | 11/2006 | Büyükbas et al. |
| 2008/0019106 | A1 | 1/2008 | Wetzel et al. |
| 2008/0108478 | A1 | 5/2008 | Wetzel et al. |
| 2010/0027227 | A1 | 2/2010 | Eglinger et al. |
| 2010/0229677 | A1 * | 9/2010 | Murakami et al. ............ 74/606 R |

FOREIGN PATENT DOCUMENTS

| | | |
|---|---|---|
| DE | 40 23 319 | 12/1991 |
| DE | 42 28 818 | 3/1994 |
| DE | 43 40 280 | 3/1995 |
| DE | 295 08 661 | 9/1996 |
| DE | 197 12 842 | 8/1998 |
| DE | 197 20 167 | 11/1998 |
| DE | 199 07 949 | 9/2000 |
| DE | 103 15 432 | 10/2004 |
| DE | 103 15 438 | 10/2004 |
| DE | 102004061818 | 7/2006 |
| DE | 102005002813 | 10/2006 |
| DE | 102005046826 | 4/2007 |
| DE | 102008014457 A1 * | 9/2008 |
| JP | 2003092476 A * | 3/2003 |
| WO | WO 92/12875 | 8/1992 |
| WO | WO 2004113857 A2 * | 12/2004 |
| WO | WO 2006/108392 | 10/2006 |

* cited by examiner

CONTROL DEVICE FOR A MOTOR VEHICLE

FIELD OF THE INVENTION

The invention relates to a control device for a motor vehicle, wherein the control device includes an electronic or electrical element arranged in an oil-tight housing. The invention further relates to a method of manufacturing such a control device.

BACKGROUND INFORMATION

For some time, it has been a standard procedure in the motor vehicle manufacturing industry to integrate control devices for the engine or gearbox into the motor vehicle assembly to be controlled, i.e. the engine or gearbox. The gear control devices in particular form an extremely compact unit as an on-site control device. In comparison with the conventional use of external control devices, this arrangement has enormous advantages in terms of costs, weight, functionality and quality. In particular, this results in a significant reduction in plug-in connections and lines.

The integration of the control devices into the gearbox sets high demands on its thermal and mechanical resilience. The functionality must be guaranteed both within a broad temperature range (approx. −40° C. to 150° C.) and under strong mechanical vibrations (up to approx. 40 g). Since the control device is surrounded by gear oil, it must also be oil-tight.

A control device of this type is known from DE 199 07 949 A1. A housing lid and a base plate on which a two-dimensional, flexible foil conductor is applied, surround a hollow area. In this hollow area, an electronic circuit is arranged on the base plate in such a manner that it is surrounded on all sides by the flexible printed circuit board. Here, conductive paths on the flexible printed circuit board are connected via bond wires with corresponding contact pads on the interconnect device. The housing lid is mounted to the base plate in an oil-tight manner via a circular ring seal. The flexible printed circuit board is extended out of the hollow area of the control device housing between the ring seal and the base plate. The flexible printed circuit board creates the connection between the electronic circuit in the hollow area of the control device housing to the electrical components such as sensors or actuators outside the hollow area.

The flexible printed circuit board is a single piece. With complex arrangements of the control device and the surrounding components, this leads to a large amount of waste of printed circuit board material and is therefore not economical, even if one only calculates or considers the recess for the electronic circuit in the center of the flexible printed circuit board.

Furthermore, the position of the electrical components outside of the hollow area, for example, is determined by the form or shape of the flexible printed circuit board, and requires a change in the form of the entire flexible printed circuit board when the position of just one component is changed.

SUMMARY OF THE INVENTION

The object of the invention is to create a control device for a motor vehicle, wherein the control device can be produced by a flexible production technique, and wherein the control device achieves a mechanically reliable electrical connection between the control electronics of the control device and external electronic components, and wherein the control device has a compact construction.

This object is attained according to the invention by a control device comprising:
a) a base plate,
b) a housing lid, which is connected with the base plate in an oil-tight manner, and which forms a hollow area with the base plate,
c) an interconnect device, which comprises at least one electronic component and/or at least one electrical contact area, and which is arranged within the hollow area on the inner side of the housing lid.
d) at least one foil conductor for the electrical connection of at least one electronic component and/or at least one electrical contact area on the interconnect device with electronic components outside the hollow area, and
e) electrical connection lines between the components and/or the contact areas on the interconnect device and the foil conductor, characterized in that
f) the housing lid comprises at least one opening in the area completely surrounding the interconnect device adjacent to an electronic component and/or an electrical contact area of the interconnect device,
g) the foil conductor is designed as at least one foil conductor strip which comprises on at least one end section one electrical contact area respectively,
h) on or in the opening from the side of the housing lid facing away from the interconnect device, one foil conductor strip is arranged respectively in such a manner that the end section of the foil conductor strip completely covers the opening,
i) over or in the opening, a lid plate is attached which completely covers the opening, in such a manner that the foil conductor strip, which is interposed therebetween, is connected in an oil-tight manner with the housing lid, and
j) the electrical connection lines between the components and/or the contact areas on the interconnect device and the electrical contact area on the end section of the foil conductor strip are arranged in the corresponding opening.

The interconnect device with the electronic components and the electrical contact areas is preferably arranged in the center on the inside of the housing lid, and is adhered to the housing lid, for example by a thermally conducting adhesive. The housing lid comprises at least one opening in the area which completely surrounds the interconnect device, adjacent to an electronic component and/or to an electrical contact area. At or in this opening, one flexible foil conductor strip is arranged respectively from the side of the housing lid which faces away from the interconnect device, i.e. from the outside. The foil conductor strip comprises one electrical contact area respectively on at least one end section. The foil conductor strip is arranged on the housing lid in such a manner that an end section thereof completely covers the opening, and the contact area of the end section lies completely in the opening.

Due to the fact that the foil conductors are designed as separate foil conductor strips, foil conductor material is saved and when changes are made to the position of an electronic component outside of the control device, the position of the corresponding foil conductor can be quickly adapted while retaining the position of the remaining foil conductors.

Advantageously, a lid plate is attached to the outer side of the housing lid in such a manner that it completely covers the opening, and the foil strip which is positioned in between is connected with the housing lid in an oil-tight manner. The electrical contact between the components and/or the contact areas on the interconnect device and the electrical contact area on the end section of a foil conductor strip in the appropriate opening is created via corresponding electrical connection lines, in particular bond wires.

In cases when the control device is surrounded by a fluid such as engine or gear oil, which has a lower temperature in the area surrounding the control device than the heat generating components on the interconnect device, heat is discharged into the fluid. Advantageously, the interconnect device is here attached directly to the inside of the housing lid.

Preferably, the foil conductor strip is adhered or laminated onto the housing lid after being positioned over the opening, at least in the area directly around the opening. Alternatively, the foil conductor strip can also be firmly attached to the lid plate.

In order to guarantee the seal of the lid plate, foil conductor strip and opening area in the housing lid, it may under certain circumstances be necessary to use an extra seal. This can be arranged as a seal which surrounds the opening between the housing lid and the foil conductor strip, or between the foil conductor strip and the lid plate. Here, it should be ensured that the seal runs entirely on the foil conductor strip. A transfer from the foil conductor strip to the housing lid could otherwise cause additional sealing problems.

In order to make the control device even more compact, the lid plates can be countersunk in the housing lid, in particular flush with the outer side of the housing lid. For this purpose, recesses which completely surround an opening are inserted on the outer side of the housing lid in the area of the openings in such a manner that each opening can accommodate a corresponding lid plate. The connection between the lid plate and the housing lid is preferably achieved by screwing or caulking.

The base plate must comprise a certain thickness in order to guarantee a mechanical strength which meets requirements. Advantageously, additional components such as connectors, sensors or actuators are arranged on the base plate. In order to achieve the lowest possible height of the control device, the housing lid is designed for reasons of simplicity as a flat part, and the hollow area between the housing lid and the base plate is designed as a corresponding depression in the base plate.

In cases when the control device is used in a gearbox, additional installation space is saved when the base place of the control device is part of the gear hydraulic unit, such as the valve plate.

A further object of the invention is to provide a method for producing a control device for a motor vehicle with the inventive features.

This object is attained according to the invention by a method comprising the steps:
a) preparing the housing lid,
b) attaching the interconnect device to the inner side of the housing lid, wherein the interconnect device comprises the at least one electronic component and/or the at least one electrical contact area, and wherein the housing lid comprises the at least one opening in the area completely surrounding the interconnect device, adjacent to the electronic component and/or the electronic contact area,
c) positioning and affixing the at least one foil conductor strip on the side of the housing lid which faces away from the interconnect device, in such a manner that the end section of the foil conductor strip completely covers the opening, and the electrical contact area on the end section of the foil conductor strip is positioned completely in the respective opening,
d) attaching the lid plate to the opening in such a manner that the foil conductor strip, which is interposed therebetween, is connected in an oil-tight manner with the housing lid,
e) attaching the electrical connection lines between the electronic components and/or the contact areas on the interconnect device and the electrical contact area on the end section of the foil conductor strip in the corresponding opening, and
f) mounting the housing lid onto the base plate in an oil-tight manner, wherein the hollow area is formed for holding the interconnect device.

First, an interconnect device is attached to the inner side of a housing lid, e.g. by means of a heat conducting adhesive. On the interconnect device, electronic components and in particular also additional electrical contact areas are attached which are electrically connected via conductive paths to the electronic components which are not arranged on the boundary area of the interconnect device. Here, the housing lid comprises at least one opening in the area completely surrounding the interconnect device, adjacent to an electronic component and/or an electrical contact area.

Then, preferably on the opening from the side of the housing lid which faces away from the interconnect device, i.e. from the outer side, one flexible foil conductor strip respectively is positioned on the housing lid in such a manner that an end section of the foil conductors strip completely covers the opening. The end section comprises an electrical contact area. When positioning the foil conductor strip on the housing lid, it must be ensured that this electrical contact area is positioned completely in the opening. The foil conductor strips are preferably affixed on the housing lid by means of cold lamination.

In the next stage, a lid plate is attached to the opening from outside in such a manner that the foil conductor strips which are positioned in between are connected in an oil-tight manner with the housing lid. The connection can be created by screwing or caulking. In particular, an addition seal which surrounds the opening can be used. This seal is arranged as required between the housing lid and the foil conductor strip or between the foil conductor strip and the lid plate.

It is also feasible that the foil conductor strip be affixed to the lid plate. Then, the seal must necessarily be attached between the housing lid and the foil conductor strip.

Then, the electronic components and/or the electrical contact areas on the interconnect device are electrically connected with the corresponding electrical contact areas on the end sections of the foil conductor strips in the respective openings in the housing lid. Here, the attachment of bond wires is preferred. It is advantageous that already at this stage, the electrical functionality of the control device can be tested independently of the further method stages and components yet to be added.

The housing lid is then mounted on a base plate. The oil tightness is in particular guaranteed by a surrounding seal on the housing lid or on the base plate. The housing lid can be mounted onto the base plate by means of screwing, riveting, adhering, or any other known connection technique.

It is also possible for the base plate to be part of a further motor vehicle component, such as a gear hydraulic system. Any components located in the base plate, whether they are actuators for activating valves, or sensors such as pressure sensors, are then under certain circumstances also electrically connected with the electronic components and/or the electrical contact areas on the interconnect device, preferably by means of spring contacts.

BRIEF DESCRIPTION OF THE DRAWINGS

Further features, advantages and details are included in the following description, in which preferred exemplary embodiments are explained in greater detail, and in which.

DETAILED DESCRIPTION OF AN EXAMPLE EMBODIMENT OF THE INVENTION

Figure 1:
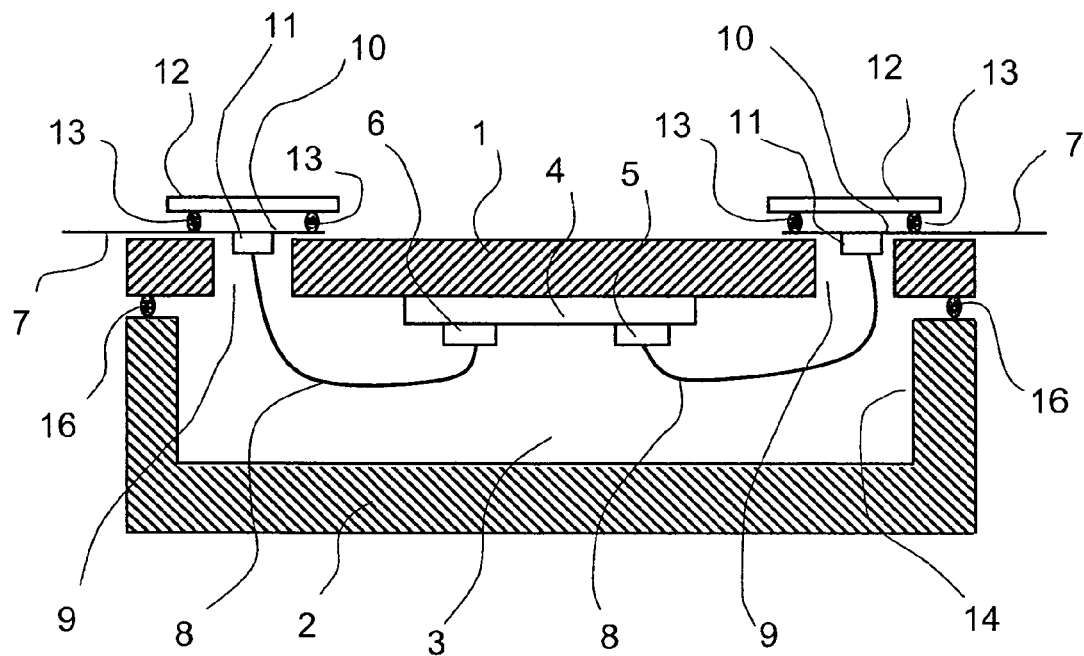
FIG. 1 shows a cross-section through a control device with the lid plate on the housing lid

According to FIG. 1, a control device for a motor vehicle comprises a housing lid 1 and a base plate 2. The housing lid 1 and the base plate 2 form a hollow area 3 in which an interconnect device 4 is located. The interconnect device 4 is adhered to the inner side of the housing lid 1, in particular by means of an electrically insulating thermal conducting adhesive. If for example the housing lid 1 is made of a metallic substance, the heat which is created on the interconnect device 4 is particularly efficiently discharged to the area adjacent to the housing lid 1. On the interconnect device 4, at least one electronic component 5 and at least one electronic contact area 6 are arranged. A contact area 6 is in particular electrically connected via conductive paths on the interconnect device 4 with electronic components which are not located in the boundary area of the interconnect device 4. The housing lid 1 comprises an opening 9 in the area completely surrounding the interconnect device 4, adjacent to an electronic component 5 and/or an electronic contact area 6. For clarification, please also refer in this context to FIG. 3. On the opening 9, a flexible foil conductor 7, which is preferably designed as a foil conductor strip, is attached on the outer side of the housing lid 1, i.e. on the side of the housing lid 1 which faces away from the interconnect device. On the end section 10 of the foil conductor strip 7, an electrical contact area 11 is arranged. The foil conductor strip 7 is positioned over the opening 9 in such a manner that it completely covers the opening 9 with its end section 10, and the electrical contact area 11 is positioned completely in the opening 9, i.e. it does not come into contact with the housing lid. Otherwise, there would be a risk of a short-circuit. The electrical contact area 11 on the foil conductor 7 in the opening 9 is in turn electrically connected via the conductor paths in the foil conductor 7 with electronic and/or electrical components, such as sensors or connectors, in a manner not shown. The electrical connection lines 8, which are usually bond wires, in turn create the electrical contact between the electronic components 5 and/or the electrical contact areas 6 on the interconnect device 4 with the corresponding electrical contact areas 11 in the opening 9. The lid plate 12 covers the opening 9 completely, and results in the fact that the foil conductor strip 7 is connected with the housing lid 1 in an oil-tight manner. The coupling of the lid plate 12 to the housing lid 1 can be achieved via a force-fit or form-fit connection such as screwing or caulking.

As is shown in FIG. 1, a ring seal 13 which surrounds the opening 9 is located between the foil conductor strip 7 and the lid plate 12, in order to guarantee additional reliability. The seal 13 can for reasons of simplicity be injected onto the lid plate 12, but could also be affixed in a corresponding groove on the side of the lid plate 12 facing towards the opening 9.

In the embodiment of the control device shown in FIG. 1, the foil conductor strip 7 is affixed for example by lamination, in particular, cold lamination, to the housing lid 1. Alternatively, it would also be possible to connect the foil conductor strip 7 with the lid plate 12, for example with a material connection such as adhesion or lamination. Then, the seal 13 would have to be attached between the housing lid 1 and the foil conductor strip 7.

The housing lid 1 is coupled via a seal 16 in an oil-tight manner to the base plate 2. In order to form the hollow area 3 between the housing lid 1 and the base plate 2, the base plate 2 comprises a square depression 14. It would also be possible to design the base plate 2 as a flat plate, and the housing lid 1 as a hood form in order to create the hollow area 3. In order to achieve a highly compact gearbox unit, the base plate 2 of the control device can simultaneously be a part of the gear hydraulic unit.

Figure 2:
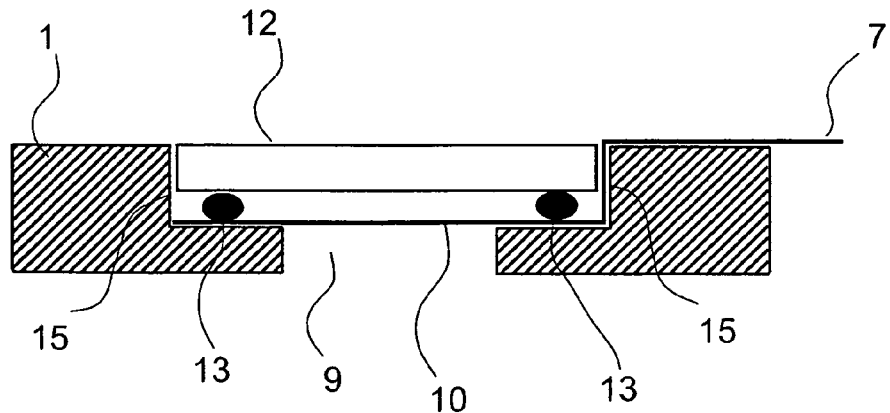
FIG. 2 shows a section from FIG. 1, wherein the lid plate is counter-sunk flush in the housing lid

FIG. 2 shows an alternative arrangement to FIG. 1 of the lid plate 12 on the housing lid 1. For this purpose, the housing lid 1 comprises on its outer side in the area of the opening 9 a depression 15 which completely surrounds the opening 9 and which corresponds in its form to the form of the lid plate. The lid plate 12 is in particular counter-sunk in the depression 15 in such a manner that it ends on its outer side flush with the outer side of the housing lid 1. The foil conductor strip 7 is as in FIG. 1 directly arranged on the housing lid 1 and covers the opening 9. The seal 13 lies in the depression 15 between the foil conductor strip 7 and the lid plate 12; however, it could also be arranged between the depression 15 and the foil conductor strip 7.

Figure 3:
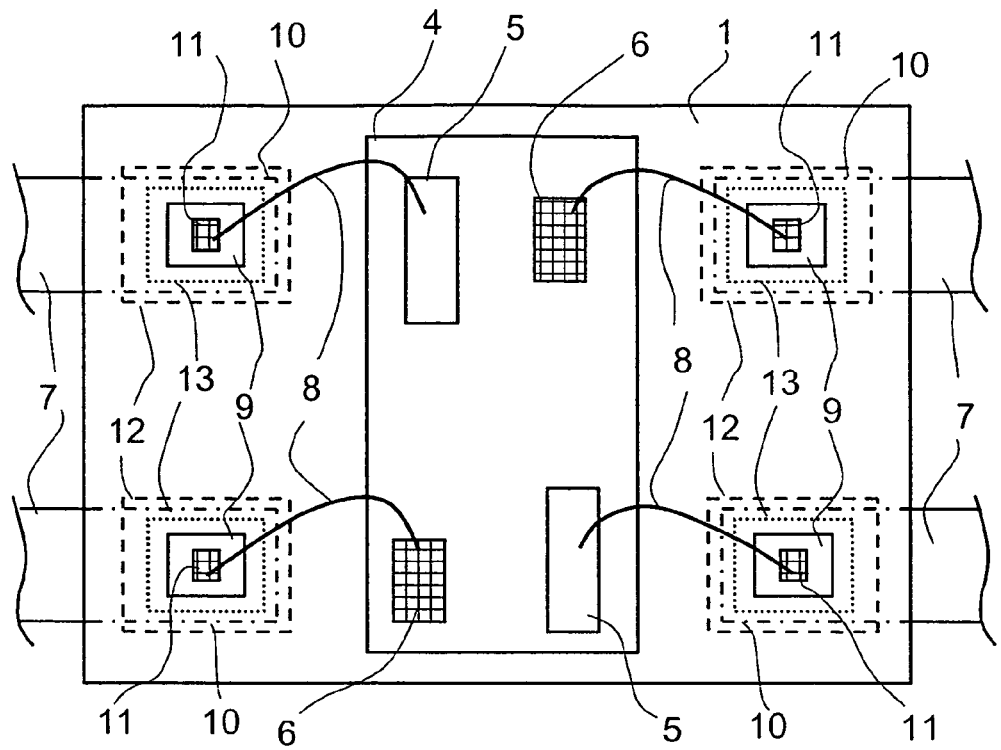
FIG. 3 shows a top view of the inside of the housing lid.

FIG. 3 shows a top view of the inner side of the housing lid 1 and serves above all as clarification of the arrangement in the area of an opening 9. The electrical contact area 11 on the end section 10 of the foil conductor strip 7 is arranged in the opening 9 in such a manner that it does not touch the housing lid 1, i.e. it cannot cause a short-circuit via the housing lid 1, which is usually metallic. The seal 13 runs around the opening 9, either between the housing lid 1 and the foil conductor strip 7, or between the foil conductor strip 7 and the lid plate 12. The seal 13 runs entirely on the foil conductor strip 7, since a transfer from the seal 13 to the housing plate 1 would potentially cause a loss of tightness. The end section 10 of the foil conductor strip 7 therefore covers both the opening 9 and the seal 13 entirely. The lid plate 12 in turn in this case covers the end section 10 entirely. This arrangement is particularly advantageous when the seal 13 seals the transfer from the lid plate 12 to the foil conductor strip 7. The transfer from the foil conductor strip 7 to the housing lid 1 is sealed by means of the type of attachment of the foil conductor strip 7 to the housing lid 1, i.e. by lamination or adhesion, for example, and additionally by means of the form-fit or force-fit connection between the lid plate 12 and the housing lid 1.

In cases when the seal 13 seals the transfer from the housing lid 1 to the foil conductor strip 7, it can certainly be advantageous for the lid plate 12 to run entirely within the end section 10 of the foil conductor strip 7 in order to avoid a transfer from the foil conductor strip 7 to the housing lid 1, and thus a potential loss of tightness.

For this purpose, the end section 10, depending on the dimensions of the lid plate, can be wider than the remainder of the foil conductor strip 7.

Figure 4:
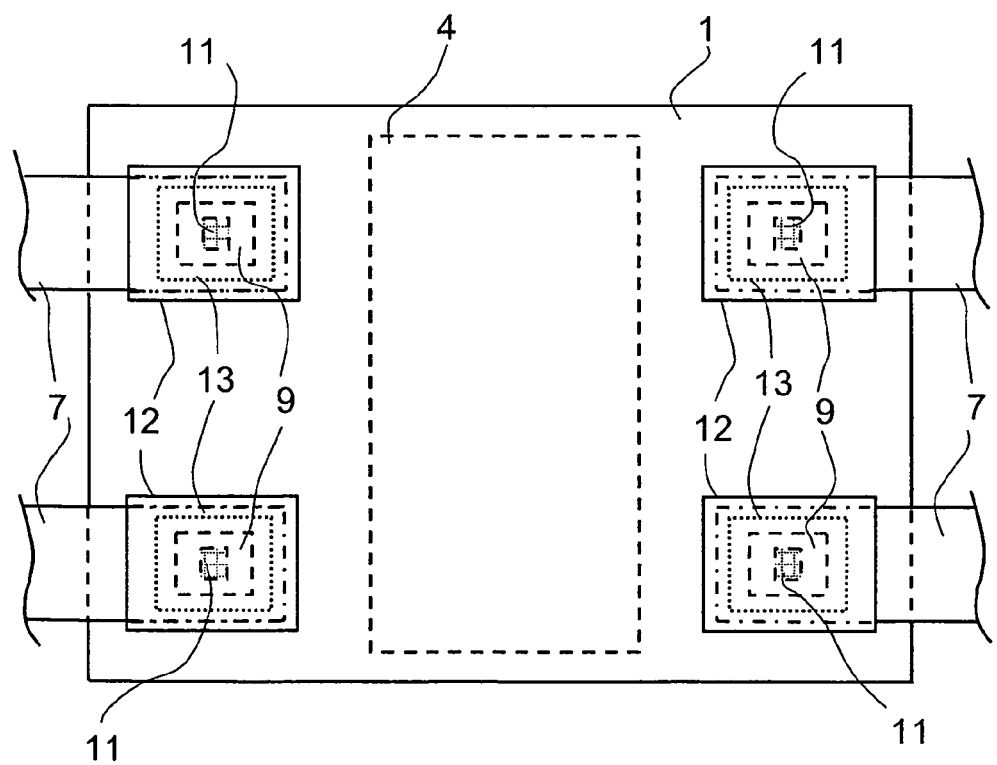
FIG. 4 shows a top view of the outer side of the housing lid

FIG. 4 shows a top view of the outer side of the housing lid 1.

LIST OF REFERENCE NUMERALS

1. Housing lid
2. Base plate
3. Hollow area
4. Interconnect device
5. Electronic component on the interconnect device
6. Electrical contact area on the interconnect device
7. Foil conductor
8. Electrical connection line
9. Opening in the housing lid 10. End section of the foil conductor facing the interconnect device
11. Electrical contact area on the foil conductor
12. Lid plate
13. Seal surrounding the opening
14. Depression in the base plate
15. Depression in the housing lid
16. Seal between the housing lid and the base plate

The invention claimed is:

1. A control device for a motor vehicle which comprises:
 a) a base (2), which is mounted on or forms a part of a transmission hydraulic unit of the motor vehicle, and which includes a base plate and side walls that bound a recessed hollow area in the base,
 b) a housing lid (1), which is connected with the base (2) in an oil-tight manner, and which covers the hollow area (3) in the base (2),
 c) a circuit carrier (4), which has mounted thereon an electronic component (5) and/or an electrical contact area (6), and which is arranged within the hollow area (3) on the inner side of the housing lid (1),
 d) at least one foil conductor (7) for the electrical connection of the electronic component (5) and/or the electrical contact area (6) on the circuit carrier (4) with electronic components outside the hollow area (3), and
 e) an electrical connection line (8) respectively between the foil conductor (7) and the electronic component (5) and/or the electrical contact area (6) on the circuit carrier (4), wherein
 f) the housing lid (1) has at least one opening (9) in an area thereof surrounding the circuit carrier (4), adjacent to the electronic component (5) and/or the electrical contact area (6) on the circuit carrier (4),
 g) the foil conductor is a foil conductor strip (7) with an electrical contact area (11) provided on an end section (10) thereof,
 h) the foil conductor strip (7) is arranged on an outer side of the housing lid (1) so that the end section (10) of the foil conductor strip (7) completely covers the opening (9),
 i) over or in the opening (9), a lid plate (12) is attached so as to completely cover the opening (9), and so that the foil conductor strip (7), which is interposed between the lid plate (12) and the housing lid (1), is connected in an oil-tight manner with the housing lid (1), and
 j) the electrical connection line (8) respectively between the electronic component (5) and/or the electrical contact area (6) on the circuit carrier (4) and the electrical contact area (11) on the end section (10) of the foil conductor strip (7) is arranged in the opening (9).

2. The control device according to claim 1, characterized in that the housing lid (1) is in direct contact with an ambient fluid, and is designed as a heat sink for heat generated by the electronic component (5) on the circuit carrier (4).

3. The control device according to claim 1, characterized in that the foil conductor strip (7) is connected with the housing lid (1), at least in the area of the opening (9), or with the lid plate (12) by a connection selected from an adhesion bond or a lamination bond.

4. The control device according to claim 1, further comprising a seal (13) which surrounds the opening (9) arranged between the housing lid (1) and the foil conductor strip (7), or between the foil conductor strip (7) and the lid plate (12).

5. The control device according to claim 1, further comprising a seal (13) which surrounds the opening (9) arranged within the foil conductor strip (7) and surrounding the electrical contact area (11) on the foil conductor strip (7).

6. The control device according to claim 1, characterized in that the housing lid (1) has, in the area of the opening (9), a stepped depression (15) which surrounds the opening (9) and receives the lid plate (12).

7. The control device according to claim 1, characterized in that the lid plate (12) is connected with the housing lid (1) by a force-fit or form-fit connection selected from a screwed connection or a caulked connection.

8. The control device according to claim 1, wherein the base integrally includes the base plate and the side walls as a single piece, and wherein the housing lid is a flat plate.

9. The control device according to claim 1, wherein the circuit carrier is adhered onto the inner side of the housing lid with a thermally conducting electrically insulating adhesive.

10. The control device according to claim 1, wherein the end section of the foil conductor strip has a width different from a body portion of the foil conductor strip other than the end section.

11. The control device according to claim 1, wherein the electrical contact area on the end section of the foil conductor strip protrudes from the foil conductor strip into the opening and is centered in the opening without contacting the housing lid.

12. The control device according to claim 1, further comprising additional electrical or electronic components mounted on the base plate in the hollow area of the base, wherein the additional electrical or electronic components are electrically connected to the electronic component and/or the electrical contact area on the circuit carrier.

13. The control device according to claim 12, further comprising spring contacts which electrically connect the additional electrical or electronic components on the base plate with the electronic component and/or the electrical contact area on the circuit carrier.

14. A method for producing a control device for a motor vehicle according to claim 1, characterized by the following stages:
 a) preparing the housing lid (1),
 b) attaching the circuit carrier (4) to the inner side of the housing lid (1), wherein the circuit carrier (4) has the electronic component (5) and/or the electrical contact area (6) thereon, and wherein the housing lid (1) has the opening (9),
 c) positioning and affixing the foil conductor strip (7) on the outer side of the housing lid (1) so that the end section (10) of the foil conductor strip (7) completely covers the opening (9), and the electrical contact area (11) on the end section (10) of the foil conductor strip (7) is positioned completely in the respective opening (9),
 d) attaching the lid plate (12) to the opening (9) in such a manner that the foil conductor strip is connected in an oil-tight manner with the housing lid (1),
 e) attaching the electrical connection lines (8) between the electronic component (5) and/or the contact area (6) on the circuit carrier (4) and the electrical contact area (11) on the end section (10) of the foil conductor strip (7) in the opening (9), and
 f) mounting the housing lid (1) onto the base (2) in an oil-tight manner, wherein the hollow area (3) is enclosed with the circuit carrier (4) received therein.

15. The method according to claim 14, characterized in that the circuit carrier (4) and/or the foil conductor strip (7) is attached by adhesion or lamination to the housing lid (1) or the lid plate (12).

16. The method according to claim 15, wherein the lamination is carried out as cold lamination.

\* \* \* \* \*